(12) United States Patent
Yu et al.

(10) Patent No.: US 6,265,291 B1
(45) Date of Patent: Jul. 24, 2001

(54) CIRCUIT FABRICATION METHOD WHICH OPTIMIZES SOURCE/DRAIN CONTACT RESISTANCE

(75) Inventors: Bin Yu, Fremont; Emi Ishida, Sunnyvale, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/224,754

(22) Filed: Jan. 4, 1999

(51) Int. Cl.[7] .................................................. H01L 21/04
(52) U.S. Cl. ........................ 438/510; 438/682; 438/649; 438/487
(58) Field of Search .................................. 438/510, 511, 438/514, 526, 527, 528, 532, 533, 649, 682, 487

(56) References Cited

U.S. PATENT DOCUMENTS

| 4,683,645 | 8/1987 | Naguib et al. . |
| 4,745,082 | 5/1988 | Kwok . |

(List continued on next page.)

FOREIGN PATENT DOCUMENTS

| 3-248433 | 11/1991 | (JP) . |
| 4-123439 | 4/1992 | (JP) . |
| 5-160396 | 6/1993 | (JP) . |

OTHER PUBLICATIONS

"Ultra–Thin–Body Silicon–on Insulator MOSFET's for Terabit–Scale Integration" by Yu, et al., Department of Electrical Engineering & Computer Sciences, University of California, Berkeley.

"Silicon Processing for the VLSI Era, vol. 1 Process Technology", Wolf, et al. Lattice Press, Sunset Beach, California, 1986, pp. 296–308.

International Electrical Devices Meeting, Dec. 7–10, 1997, "Sub–100nm Gate Length Metal Gate NMOS Transistors Fabricated by a Replacement Gate Process" Chatterjee, et al., 1997 IEEE.

"Sub 50–nm FinFET:PMOS" by Huang et al. 1999,IEEE.

Primary Examiner—Charles Bowers
Assistant Examiner—Yennhu B. Huynh
(74) Attorney, Agent, or Firm—Foley & Lardner

(57) ABSTRACT

A method of manufacturing an integrated circuit to optimize the contact resistance between impurity diffusing layers and silicide is disclosed herein. The method includes implanting a first material to a layer of semiconductor to create a buried amorphous silicon layer; implanting a second material in the layer of semiconductor and buried amorphous layer, forming a dopant profile region with a curved shape; depositing a layer of metal on the layer of semiconductor; melting the buried amorphous layer to reconfigure the curved shape to a substantially vertical profile of maximum dopant concentration; and forming silicide with the layer of semiconductor and layer of metal, the bottom of the silicide located in the vertical shape on the dopant profile region.

20 Claims, 2 Drawing Sheets

U.S. PATENT DOCUMENTS

| | | |
|---|---|---|
| 4,784,718 | 11/1988 | Mitani et al. . |
| 4,835,112 | 5/1989 | Pfiester et al. . |
| 4,954,867 | 9/1990 | Hosaka . |
| 5,108,954 | 4/1992 | Sandhu et al. . |
| 5,258,637 | 11/1993 | Sandhu et al. . |
| 5,264,382 | 11/1993 | Watanabe . |
| 5,374,575 | 12/1994 | Kim et al. . |
| 5,391,510 | 2/1995 | Hsu et al. . |
| 5,393,685 | 2/1995 | Yoo et al. . |
| 5,429,956 | 7/1995 | Shell et al. . |
| 5,516,707 | 5/1996 | Loh et al. . |
| 5,593,907 | 1/1997 | Anjum et al. . |
| 5,607,884 | 3/1997 | Byun . |
| 5,654,570 | 8/1997 | Agnello . |
| 5,675,159 | 10/1997 | Oku et al. . |
| 5,716,861 | 2/1998 | Moslehi . |
| 5,793,090 | 8/1998 | Gardner et al. . |
| 5,811,323 | 9/1998 | Miyasaka et al. . |
| 5,825,066 | 10/1998 | Buynoski . |
| 5,851,869 | 12/1998 | Urayama ............................. 438/238 |
| 5,856,225 | 1/1999 | Lee et al. . |
| 5,858,843 | 1/1999 | Doyle et al. . |
| 5,888,888 * | 3/1999 | Talwar et al. ........................ 438/533 |
| 5,908,307 | 6/1999 | Talwar et al. . |
| 5,915,196 | 6/1999 | Mineji . |
| 5,953,616 | 9/1999 | Ahn . |
| 6,008,111 | 12/1999 | Fushida et al. . |
| 6,017,808 | 1/2000 | Wang et al. . |
| 6,030,863 | 2/2000 | Chang et al. . |
| 6,037,204 | 3/2000 | Chang et al. . |
| 6,072,222 | 6/2000 | Nistler . |
| 6,080,645 | 6/2000 | Pan . |
| 6,096,614 | 8/2000 | Wu . |
| 6,103,609 | 8/2000 | Lee et al. . |

\* cited by examiner

CIRCUIT FABRICATION METHOD WHICH OPTIMIZES SOURCE/DRAIN CONTACT RESISTANCE

FIELD OF THE INVENTION

The present invention is related to integrated circuit (IC) devices and processes of making IC devices. More particularly, the present invention relates to an IC which is optimized for small size and low source/drain contact resistance.

BACKGROUND OF THE INVENTION

Integrated circuits (ICs) include a multitude of transistors formed on a semiconductor substrate. Transistors, such as, metal oxide semiconductor field effect transistors (MOSFETs), are generally built on the top surface of a bulk substrate. The substrate is doped to form impurity diffusing layers (i.e. source and drain regions). Between the source and drain regions is a conductive layer which operates as a gate for the transistor. The gate controls current in a channel between the source and the drain regions.

To reduce series resistance associated with the source and drain regions, manufacturers use a process known as "silicidation." Typically, silicidation is accomplished by depositing a refractory metal (e.g. Co, Ti, Ni) onto an exposed surface of source and drain regions in a semiconductor substrate. The atoms of silicon (Si) in the source and drain regions react with the atoms of the refractory metal, forming a silicide layer. The layer of silicide reduces the contact resistance at the silicide source/drain junction by helping break through the residual surface oxide so that good electrical contact can be made.

As MOSFETs are made smaller and smaller, however, the source and drain regions become more shallow and contact resistance associated with the source and drain regions increases. The source/drain contact resistance (i.e. silicide junction resistance) is very critical to transistor performance. High contact resistance degrades the transistor drive current and, thus, also degrades transistor speed and performance.

U.S. Pat. No. 5,258,637, issued Nov. 2, 1993, and U.S. Pat. No. 5,108,954, issued Apr. 28, 1992, both to Sandhu and Anjum, disclose a method of reducing contact resistance at silicide/active area interfaces. Sanhu and Anjum explain that during the elevated temperature anneal to form the silicide, the conductivity enhancing impurity (or dopant) tends to diffuse toward the silicide region. The void of dopants near the silicide increases the contact resistance between the silicide and active areas.

In the process disclosed by Sandhu and Anjum, germanium is implanted through the contact opening and into the active area of the wafer. As such, the germanium restricts diffusion of the conductivity enhancing impurity therethrough during the silicide anneal. While the germanium implant may reduce the contact resistance caused by a void of dopants near the silicide, the Sanhu and Anjum process does not optimize the contact resistance by maximizing the level of dopants proximate to the silicide.

The conventional method of silicidation makes it very difficult to locate the bottom of the silicide layer in the region of peak dopant concentration during transistor fabrication. The least contact resistance would be achieved by locating the bottom of the silicide layer in the peak dopant concentration. Physically, though, conventional methods cannot do this. The manufacturing process can be varied by random process variation, making precise placement of the silicide layer difficult. Further, the peak is usually located close to the surface of the silicon semiconductor layer. When silicidation occurs, the silicon is consumed, locating the bottom of the silicide layer deeper than the peak. As the amount of contact resistance resulting from fabrication depends on how close the bottom of the silicide formation is to the peak dopant concentration, the conventional fabrication process results in excessive contact resistance.

Thus, there is a need for a method to optimize MOSFET source/drain contact resistance in the fabrication process. Further, there is a need to reduce the contact resistance without implanting germanium at a precise location in the source/drain regions. Even further, there is a need for fabricating a transistor such that the bottom of the silicide always intersects with a high density of dopant.

SUMMARY OF THE INVENTION

One embodiment of the invention relates to a method of manufacturing an integrated circuit. The method includes implanting a first material in a layer of semiconductor, the first material creating a buried amorphous layer; implanting a second material in the layer of semiconductor and layer of amorphous semiconductor, the second material forming a profile region with a curved shape; depositing a layer of metal on the layer of semiconductor; exposing laser energy to the integrated circuit such that the amorphous semiconductor layer is melted and the profile region has a box-like shape; and forming a semiconductor/metal layer with the layer of semiconductor and the layer of metal, whereby the bottom of the semiconductor/metal layer is located in the profile region.

Another embodiment of the invention relates to a method of manufacturing an integrated circuit including amorphosizing a silicon structure, creating a buried amorphous silicon structure; implanting an ion in the silicon structure and amorphous silicon structure; depositing a layer of metal on the silicon structure; exposing laser energy to the integrated circuit such that the amorphous silicon structure is melted; and forming silicide with the silicon structure and layer of metal, the bottom of the silicide located in the amorphous silicon structure.

Another embodiment of the invention relates to a method of manufacturing an ultra-large scale integrated circuit including a plurality of transistors, each transistor having a layer of silicon with impurity diffusing layers and a layer of silicide adjacent each impurity diffusing layer, the contact resistance between the impurity diffusing layers and the corresponding layer of silicide being optimized. The method includes amorphosizing the layer of silicon, creating a buried amorphous silicon layer; implanting a dopant in the layer of silicon and amorphous silicon layer; depositing a layer of metal on the insulator structure; exposing laser energy to the integrated circuit such that the amorphous silicon layer is melted; and forming silicide with the insulator structure and layer of metal, the bottom of the silicide located in the amorphous silicon layer.

BRIEF DESCRIPTION OF THE DRAWINGS

The invention will become more fully understood from the following detailed description, taken in conjunction with the accompanying drawings, wherein like reference numerals refer to like parts, in which.

DETAILED DESCRIPTION OF THE PREFERRED EMBODIMENTS

Figure 1:
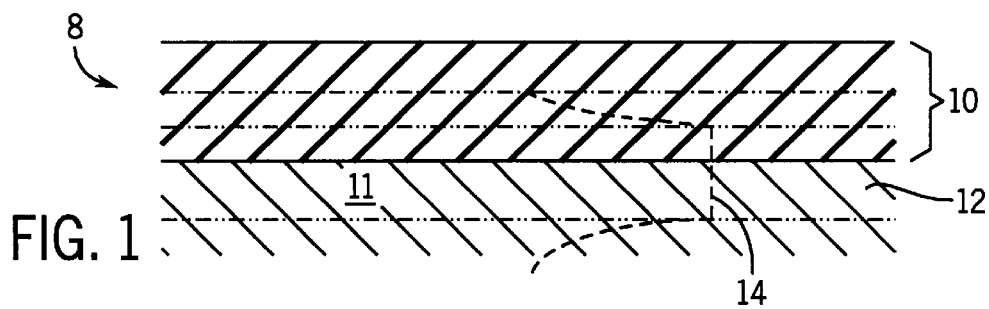
FIG. 1 is a cross-sectional view of a portion of an integrated circuit in accordance with an exemplary embodiment of the present invention, the integrated circuit includes a silicide layer and a silicon layer.

Referring to FIG. 1, a cross-sectional view of a portion 8 of an integrated circuit is illustrated in accordance with an exemplary embodiment of the present invention. Portion 8 includes a silicide layer 10 and a substrate or silicon layer 12. Silicide layer 10 is a metal/semiconductor layer disposed over silicon layer 12 (shown in FIG. 1 with dashed lines). Silicon layer 12 includes a profile region 14 indicating relative concentration of impurities in silicon layer 12. Silicon layer 12 may, in other embodiments, be a layer of some other kind of semiconductor type of material. Layer 10 can be provided over, in contact with or integral a source or drain such as a drain region 11.

Figure 2:
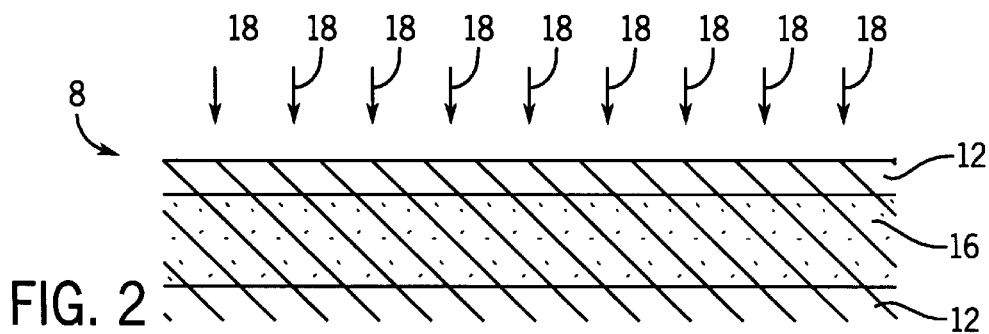
FIG. 2 is a cross-sectional view of the portion of the IC illustrated in FIG. 1, showing an implantation step to create a buried amorphous silicon (Si) region.

With reference to FIGS. 2–5, the fabrication of portion 8 is described below. In FIG. 2, a cross-sectional view of portion 8 illustrates an implantation step to create a buried amorphous silicon region 16 in silicon layer 12. In the implantation step, an implantation species 18 is implanted in silicon layer 12 to create buried amorphous region 16. Implantation species 18 can be $Si^+$ or $Ge^+$. Implantation species 18 is implanted such that buried amorphous region 16 lacks a distinct crystalline structure. Silicon layer 12, in contrast, has a distinct crystalline structure. Silicon layer 12 and buried amorphous region 16 are also of a thickness which, when silicidation occurs in FIG. 5, allows the bottom of silicide layer 10 to be located in buried amorphous region 16.

Figure 3:
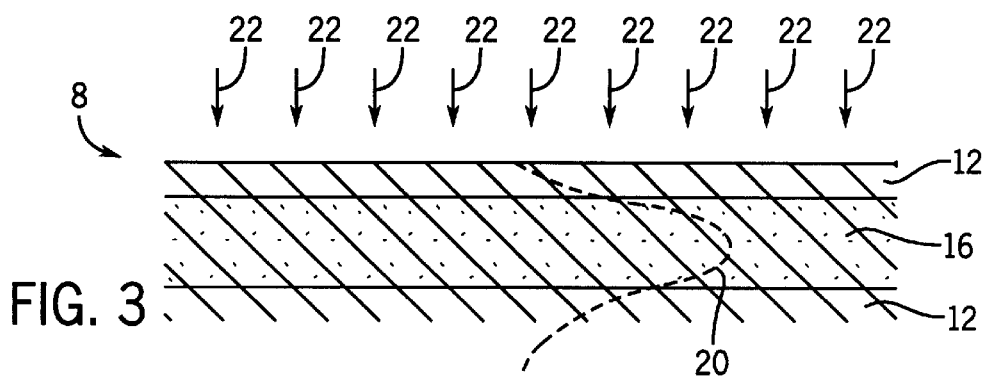
FIG. 3 is a cross-sectional view of the portion of the IC illustrated in FIG. 1, showing an implantation step and a resulting profile region.

In FIG. 3, a cross-sectional view of portion 8 illustrates an implantation step and a resulting curved profile region 20 in silicon layer 12. In the implantation step, an implantation species 22 is implanted in the silicon layer 12 and buried amorphous region 16. Implantation species 22 in one particular embodiment is a dopant, such as phosphorous, boron, boron difluoide ($BF_2$), arsenic, indium or other material. Implantation species 22 adds impurity to silicon layer 12 and buried amorphous region 16, as represented by curved dopant profile region 20. Curved dopant profile region 20 represents the relative concentration of impurities in silicon layer 12 and buried amorphous region 16.

Figure 4:
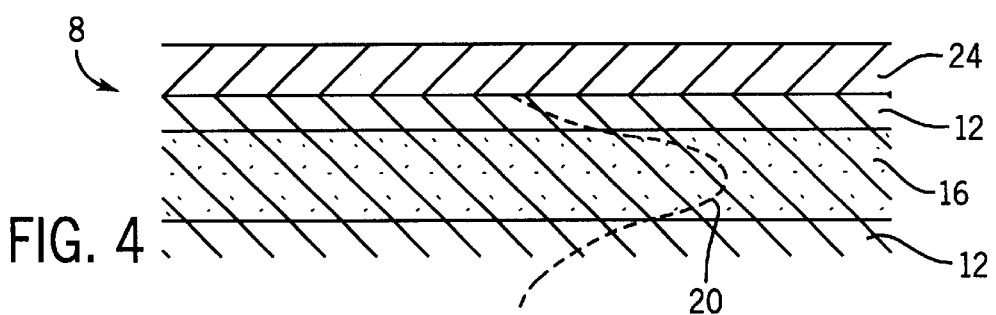
FIG. 4 is a cross-sectional view of the portion of the IC illustrated in FIG. 1, showing a metal deposition step on the silicon layer.

In FIG. 4, a cross-sectional view of portion 8 illustrates a metal deposition step on silicon layer 12. In the metal deposition step, a metal 24 is disposed over silicon layer 12. Metal 24 can be a refractory metal. Material 24 can be Co, Ti, Ni, W or any other metal appropriate for the silicidation process.

Figure 5:
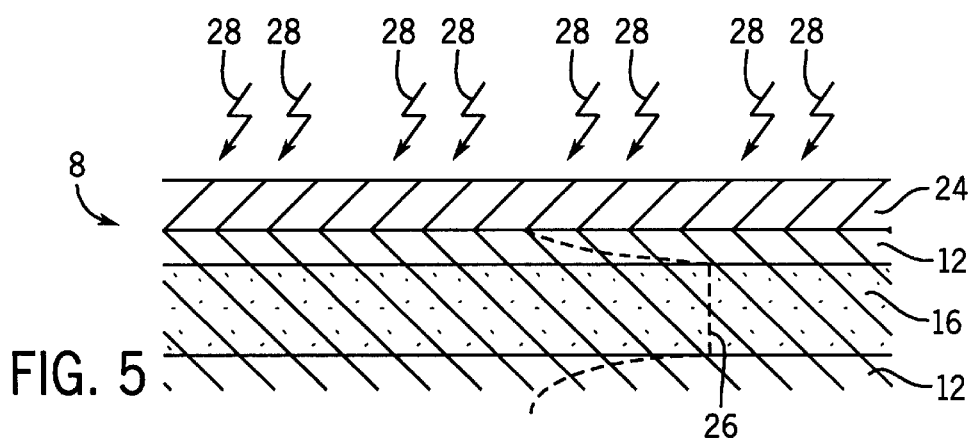
FIG. 5 is a cross-sectional view of the portion of the IC illustrated in FIG. 1, showing a laser exposure step and the resulting dopant profile region.

In FIG. 5, a cross-sectional view of portion 8 illustrates a laser exposure step and a resulting box-like dopant profile region 26. In the laser exposure step, laser pulse 28 emits from, for example, an excimer laser and is directed to metal 24, silicon layer 12, and buried amorphous region 16. During the laser exposure step, laser pulse 28 creates a temperature high enough to melt buried amorphous region 16, but not high enough to melt silicon layer 12 or metal 24. In one particular embodiment, the temperature range which melts buried amorphous region 16 is 900–1000° C. Melting of buried amorphous region 16 also impurities present in buried amorphous region 16, as represented by curved profile region 20 in FIG. 4. The redistribution of impurities results in box-like profile region 26 as shown in FIG. 5. Silicon layer 12 intermediate metal 24 and buried amorphous region 16 prevents atoms from metal 24 from diffusing into buried amorphous region 16.

Figure 6:
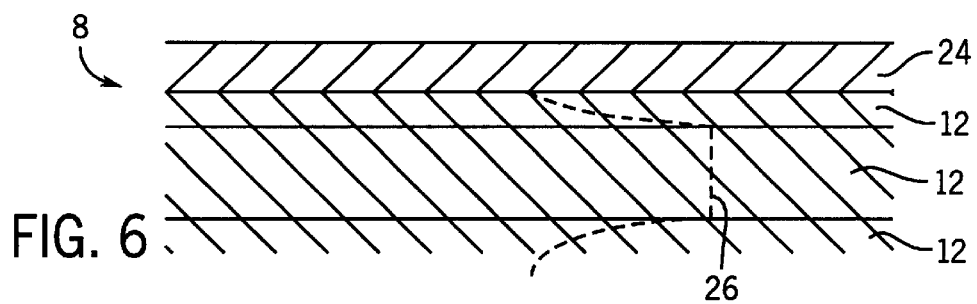
FIG. 6 is a cross-sectional view of the portion of the IC illustrated in FIG. 1, showing a recrystalizing step and the resulting crystallized layer.

In FIG. 6, a cross-sectional view of portion 8 illustrates a recrystalizing step and a resulting crystalized layer 12. In the recrystalizing step, laser pulse 28 is removed and buried amorphous region 16 recrystalizes.

After recrystalization of buried amorphous region 16, silicide formation is performed to create silicide layer 10, shown in FIG. 1. Silicide layer 10 is formed by depositing a refractory metal (e.g., Co, Ti, Ni) onto an exposed surface of impurity diffused layers in a semiconductor substrate. During silicidation, atoms of silicon from silicon layer 12 and the recrystalized silicon layer of former buried amorphous region 16 (FIG. 6) react with atoms of the refractory metal from metal 24 to form silicide layer 10. Silicide layer 10 is located over silicon layer 12 such that the bottom of silicide layer 10 is located in a flat portion of box-like dopant profile region 26, representing relative concentration of impurities (e.g. dopants, ions) in silicon layer 12. Such location, by proper design, completely consumes silicon layer 12 intermediate metal 24 and former buried amorphous region 16 into silicide layer 10. Location of silicide layer 10 depends on the thickness of silicon layer 12 and former buried amorphous region 16. The thickness of silicon layer 12 and former buried amorphous region 16 provides a location for silicide layer 10 adjacent a high concentration of impurities after the silicidation process. FIG. 1 shows where drain and source regions could be located in silicon layer 12. Such placement optimizes (i.e., minimizes) contact resistance at the junction of silicide layer 10 and silicon layer 12. If there is a reasonably large thickness of the buried amorphous region 16, the process window for the manufacturing is large.

It is understood that while the detailed drawings, specific examples, and particular values given provide a preferred exemplary embodiment of the present invention, it is for the purpose of illustration only. The method and apparatus of the invention is not limited to the precise details and conditions disclosed. For example, although particular drain and source structures are described, other types of active regions can utilize the principles of the present invention. Various changes may be made to the details disclosed without departing from the spirit of the invention which is defined by the following claims.

What is claimed is:

1. A method of manufacturing an integrated circuit comprising:

implanting a first material in a layer of semiconductor to create a buried amorphous layer;

implanting a second material in the layer of semiconductor and the buried amorphous layer, the second material forming a dopant profile region with a curved shape;

depositing a layer of metal on the layer of semiconductor;

melting the buried amorphous layer to reconfigure the curved shape of the dopant profile region to a substantially flat profile of maximum dopant concentration; and forming a semiconductor/metal layer with the layer of semiconductor and the layer of metal, whereby the bottom of the semiconductor/metal layer extends to the maximum dopant concentration.

2. The method of claim 1, wherein the implanting step includes implanting silicon.

3. The method of claim 1, wherein the layer of semiconductor is a layer of single crystal silicon.

4. The method of claim 1, wherein the implanting a second material step includes implanting an inert ion.

5. The method of claim 1, wherein the second material is a dopant.

6. The method of claim 1, wherein the metal is cobalt.

7. The method of claim 1, wherein the melting creates a temperature such that the buried amorphous layer melts but the layer of semiconductor does not.

8. The method of claim 1, wherein the layer of semiconductor and the buried amorphous layer are of a thickness such that the semiconductor/metal layer is located in the dopant profile region after formation of the semiconductor/metal layer.

9. The method of claim 1, wherein the layer of semiconductor intermediate the layer of metal and buried amorphous layer is completely consumed during the formation of the semiconductor/metal layer.

10. The method of claim 1, wherein the layer of semiconductor prevents atoms from the layer of metal from diffusing into the buried amorphous layer when melted.

11. A method of manufacturing an integrated circuit comprising:

amorphosizing a silicon structure, creating a buried amorphous silicon structure under a crystalized silicon layer;

implanting a dopant in the crystalline silicon layer and the amorphous silicon structure;

depositing a layer of metal on the crystalline silicon layer;

melting the buried amorphous silicon structure;

recrystalizing the buried amorphous silicon structure; and forming silicide with the silicon structure and the layer of metal, the bottom of the silicide located in the recrystalized buried amorphous silicon structure.

12. The method of claim 11, wherein the crystallized silicon layer and the amorphous silicon structure are of a thickness so that the silicide is adjacent a highest concentration of dopants in the silicon structure.

13. The method of claim 11, wherein amorphosizing includes implanting an implantation material to the silicon structure.

14. The method of claim 13, wherein the implantation material is silicon.

15. The method of claim 11, wherein the silicon structure is completely consumed during the formation of the silicide.

16. The method of claim 11, wherein laser energy creates an increased concentration of implanted ions in the amorphous silicon structure.

17. A method of manufacturing an ultra-large scale integrated circuit including a plurality of transistors, optimized, the method comprising:

amorphosizing a layer of silicon, creating a buried amorphous silicon layer;

implanting a dopant in the layer of silicon and the buried amorphous silicon layer;

depositing a layer of metal on the layer of silicon;

exposing energy to the integrated circuit such that the buried amorphous silicon layer is melted; and forming silicide with the layer of silicon and the layer of metal.

18. The method of claim 17, wherein amorphosizing includes the implantation of silicon in the layer of silicon.

19. The method of claim 17, wherein the energy is laser energy and the laser energy melts the buried amorphous silicon layer but does not melt the layer of silicon.

20. The method of claim 17, wherein the melted buried amorphous silicon layer has an increased concentration of dopants at the junction with the silicide.

* * * * *

UNITED STATES PATENT AND TRADEMARK OFFICE
CERTIFICATE OF CORRECTION

PATENT NO. : 6,265,291 B1
DATED : July 24, 2001
INVENTOR(S) : Yu et al.

It is certified that error appears in the above-identified patent and that said Letters Patent is hereby corrected as shown below:

Column 6, claim 17,
Line 19, delete "optimized,".

Signed and Sealed this

Fourth Day of December, 2001

*Attest:*

*Attesting Officer*

NICHOLAS P. GODICI
*Acting Director of the United States Patent and Trademark Office*